United States Patent
Ogawa et al.

(10) Patent No.: US 7,622,760 B2
(45) Date of Patent: Nov. 24, 2009

(54) MOS TYPE VARIABLE CAPACITANCE DEVICE

(75) Inventors: Takaoki Ogawa, Kawasaki (JP); Kazuhiro Tomita, Kawasaki (JP); Koju Aoki, Kasugai (JP)

(73) Assignee: Fujitsu Microelectronics Limited, Tokyo (JP)

(*) Notice: Subject to any disclaimer, the term of this patent is extended or adjusted under 35 U.S.C. 154(b) by 0 days.

(21) Appl. No.: 11/047,559

(22) Filed: Feb. 2, 2005

(65) Prior Publication Data

US 2005/0127411 A1 Jun. 16, 2005

Related U.S. Application Data

(63) Continuation of application No. PCT/JP03/02443, filed on Mar. 3, 2003.

(51) Int. Cl.
*H01L 27/12* (2006.01)
(52) U.S. Cl. .................... 257/300; 257/E27.112
(58) Field of Classification Search ......... 257/300–316, 257/202, 288, 369; 331/168
See application file for complete search history.

(56) References Cited

U.S. PATENT DOCUMENTS

| | | | |
|---|---|---|---|
| 4,216,451 A * | 8/1980 | Nishimura et al. ............ 334/15 |
| 4,453,090 A | 6/1984 | Sempel et al. | |
| 6,228,696 B1 * | 5/2001 | Nguyen et al. ............. 438/217 |
| 6,246,076 B1 * | 6/2001 | Lipkin et al. ................. 257/77 |
| 6,407,412 B1 | 6/2002 | Krzysztof et al. | |
| 2001/0015449 A1 | 8/2001 | Bai et al. | |
| 2004/0032004 A1 * | 2/2004 | Coolbaugh et al. .......... 257/510 |

(Continued)

FOREIGN PATENT DOCUMENTS

EP 0 720 238 A2 7/1996

(Continued)

OTHER PUBLICATIONS

Wong W et al, "*Wide Tuning Range Inversion-Mode Gated Varactor and its Application on a 2-GHZ VCO*", 1999 Symposium on VLSI Circuits. Digest of Technical Papers. Kyoto, Jun. 17, 1999, pp. 53-54, vol. CONF. 13, New York, NY.

*Primary Examiner*—Nathan W Ha
(74) *Attorney, Agent, or Firm*—Arent Fox LLP (57) ABSTRACT

An n-well is formed in a p-type semiconductor substrate. A gate insulative film is formed to the p-type semiconductor substrate and the n-well, and a gate electrode is formed on the gate insulative film. A source layer selectively diffused with n-type impurities at high concentration is formed adjacent to the gate insulative film on the surface of the p-type semiconductor substrate, the n-well and a region extending on both of them. Further, a contact layer selectively diffused with p-type impurities at high concentration is formed being spaced from the source layer. A capacitance characteristic of good linearity over a wide range relative to the inter-terminal voltage VT can be obtained by applying an inter-terminal voltage VT between the source layer and the gate electrode. A MOS type variable capacitance device capable of obtaining a characteristic of good linearity for a wide range relative to the inter-terminal voltage VT and capable of coping with the improvement of the performance of a VCO circuit, etc., as well as simple in the structure, and capable of being manufactured easily with no requirement for addition of masks and steps can be provided.

8 Claims, 12 Drawing Sheets

U.S. PATENT DOCUMENTS

| | | | |
|---|---|---|---|
| 2004/0100340 A1* | 5/2004 | Cui et al. | 331/176 |
| 2004/0201052 A1* | 10/2004 | Nakashiba | 257/296 |
| 2004/0206999 A1* | 10/2004 | Hyde et al. | 257/312 |
| 2004/0263269 A1* | 12/2004 | Takamatsu | 331/108 C |
| 2005/0093000 A1* | 5/2005 | Tanimoto et al. | 257/77 |

FOREIGN PATENT DOCUMENTS

| | | |
|---|---|---|
| EP | 0 822 601 A1 | 2/1998 |
| JP | 48-34685 | 5/1973 |
| JP | 50-28283 | 3/1975 |
| JP | 64-061070 | 3/1989 |
| JP | 2000-058877 | 2/2000 |

\* cited by examiner

FIG. 17b

MOS TYPE VARIABLE CAPACITANCE DEVICE

CROSS-REFERENCE TO RELATED APPLICATIONS

This application is a continuation application based upon and claims the benefit of the prior PCT International Patent Application No. PCT/JP2003/02443 filed on Mar. 3, 2003, the entire contents of which are incorporated herein by reference.

BACKGROUND OF THE INVENTION

1. Field of the Invention

The present invention concerns a MOS type variable capacitance device. Particularly, it relates to a MOS type variable capacitance device which can be manufactured with ease by a general manufacturing process for semiconductor circuit devices and attributes to the improvement of the performance of voltage controlled oscillators and the like.

2. Description of Related Art

Figure 14:
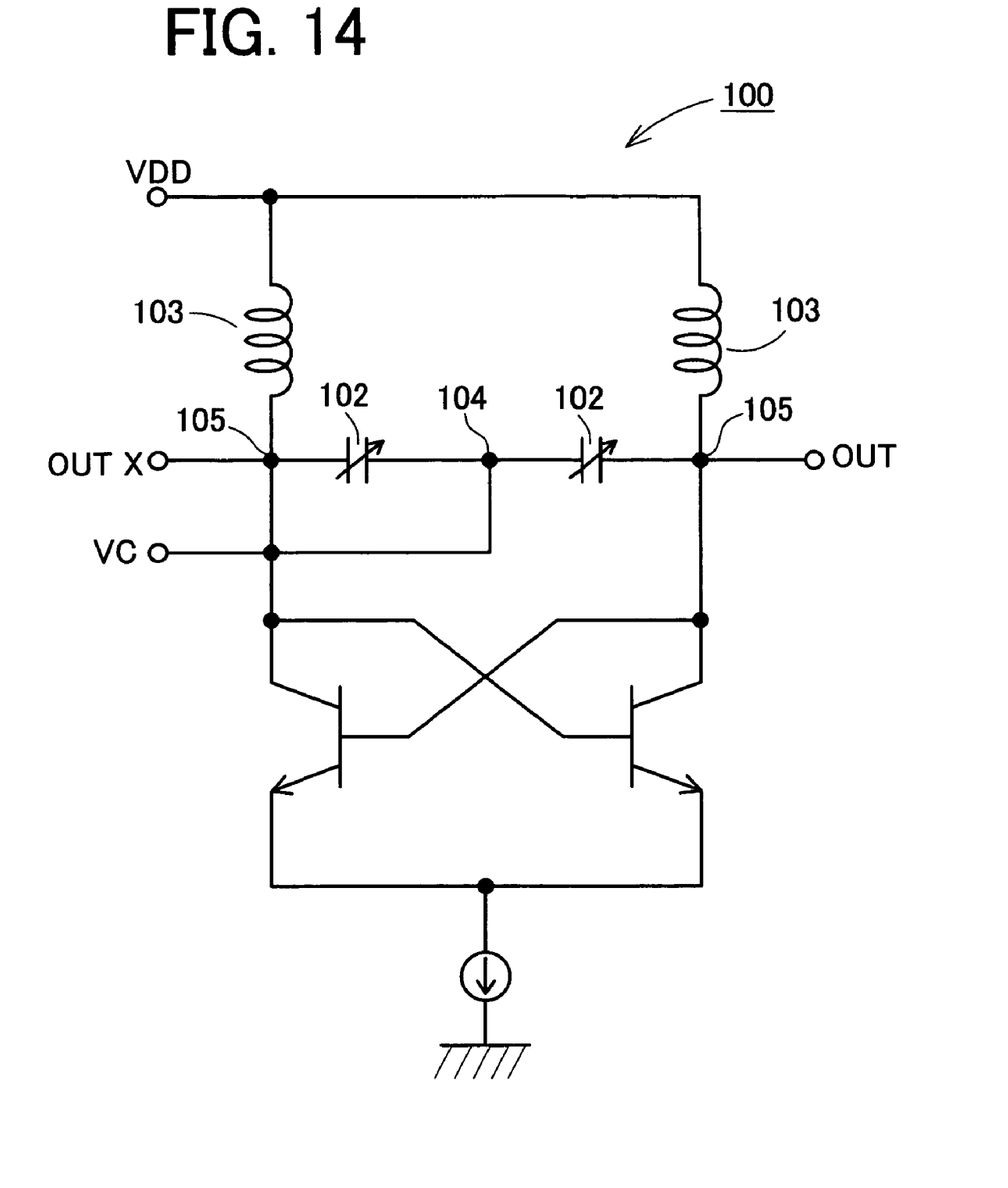
FIG. 14 is a circuit diagram showing an example of a VCO circuit.

An example of circuits using variable capacitance devices includes a voltage controlled oscillation circuit (hereinafter simply referred to as VCO circuit). FIG. 14 shows a VCO circuit 100 as an example. The VCO circuit 100 includes two variable capacitance devices 102. A control voltage VC is applied to a node 104 as a connection point of them. Since a constant voltage is applied in the form of a DC current to a node 105, the capacitance value of the variable capacitance device 102 can be controlled by controlling the control voltage VC. Accordingly, in the VCO circuit 100, an LC resonance frequency for the variable capacitance devices 102 and coils 103 can be controlled by the control voltage VC. It is desirable for the characteristic of the VCO circuit that the obtained oscillation frequency changes linearly for a wide range.

For obtaining the characteristic of the VCO circuit 100, it is necessary to use a variable capacitance device that can obtain the linear change of the capacitance over a wide range relative to the controlled voltage VC.

Figure 15:
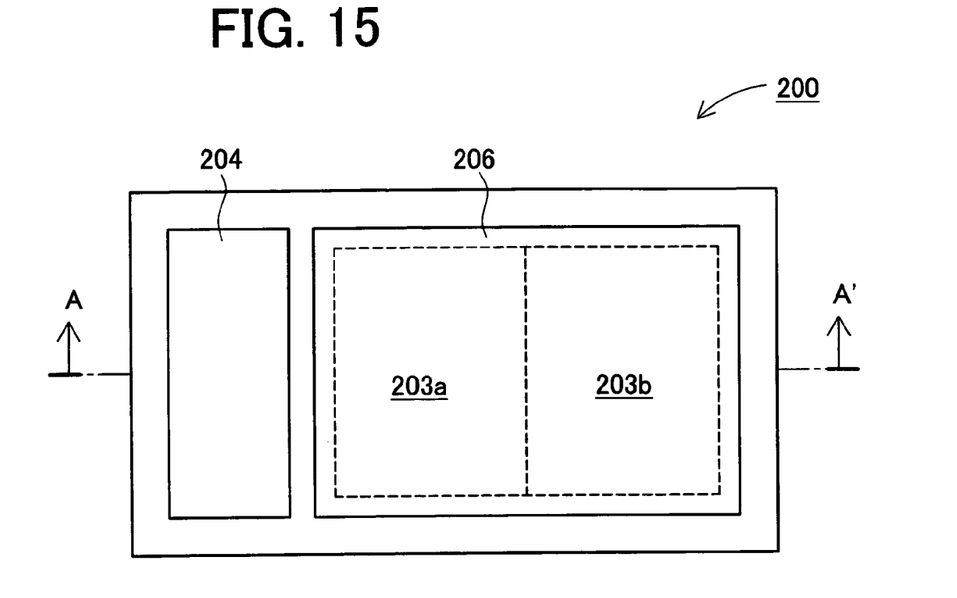
FIG. 15 is a plan view of a MOS type variable capacitance device in Patent Document 1.
Figure 16:
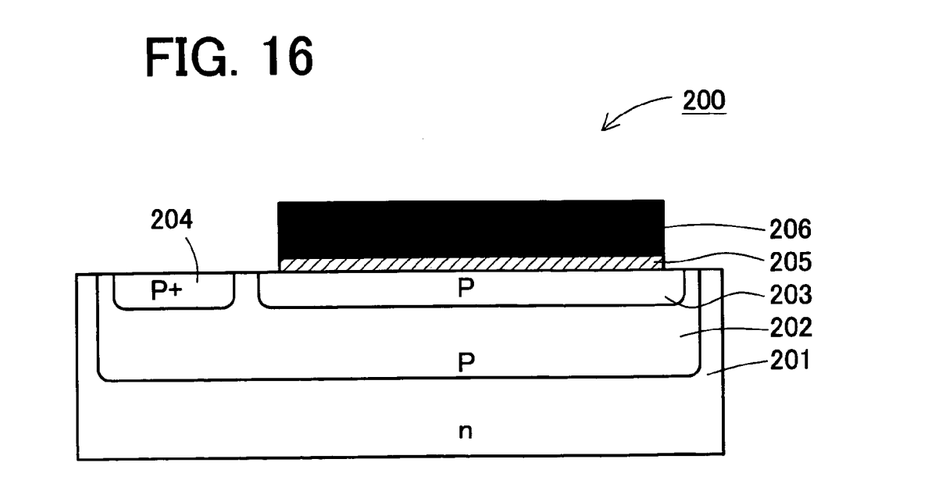
FIG. 16 is a cross sectional view along line A-A' in FIG. 15.

FIG. 15 shows a plan view schematically showing a MOS type variable capacitance device disclosed in JP-A No. 2000-58877 as a Patent Document 1 and FIG. 16 shows a cross sectional view taken along line A-A' in FIG. 15. In a MOS type variable capacitance device 200, a first semiconductor layer 202 comprising a p-well is formed within an n-type semiconductor substrate 201 as shown in FIG. 16. On the surface of the first semiconductor layer 202, p-type impurities are diffused selectively to form a second semiconductor layer 203. Further, a contact layer 204 formed by selectively diffusing p-type impurities at high concentration is formed being spaced from the second semiconductor layer 203. Then, on the surface of the second semiconductor layer 203, a gate insulative layer 205 comprising silicon oxide is formed, and a gate electrode 206 is formed on the surface of the gate insulative layer 205.

The second semiconductor layer 203 is constituted with plural regions 203a and 203b (two regions in the drawing) having different flat band voltages. The regions 203a and 203b of different flat band voltages are formed such that the impurity concentration changes stepwise.

The regions 203a and 203b of different flat band voltages constitute capacitances C100 and C200 respectively. Then, the capacitance CT100 of the MOS type variable capacitance device 200 forms a synthesis capacitance of capacitances C100 and C200. The capacitances C100 and C200 are changed by changing the inter-terminal voltage VT between the gate electrode 206 and the contact layer 204 and, accordingly, the capacitance CT100 of the MOS type variable capacitance device 200 changes.

Figure 17A:
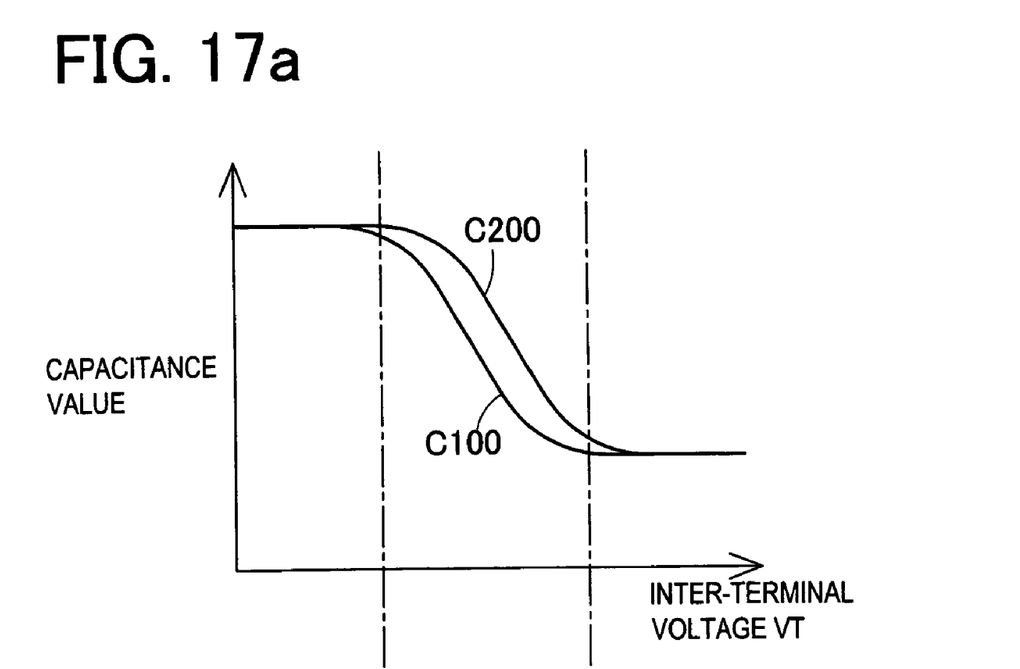
FIGS. 17a and 17b are views showing a characteristic of a MOS type variable capacitance device in Patent Document 1.
Figure 17B:
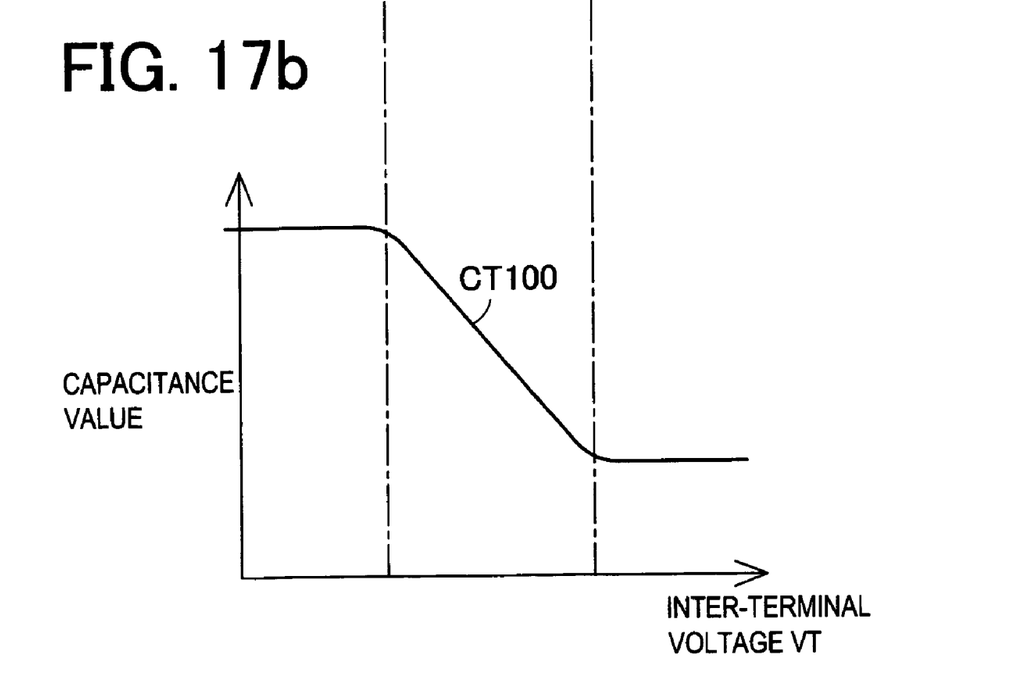

FIG. 17a shows the characteristic of the capacitance change relative to the inter-terminal voltage VT in a case where the flat band voltages for the regions 203a and 203b are VFB and VFB' respectively. While the respective characteristic curves for the capacitances C100 and C200 shift in parallel in accordance with the difference of the flat band voltages VFB, VFB' and the voltage value for the inter-terminal voltage VT at which the change of capacitance starts is shifted, profiles of the characteristic curves of the capacitance C100 and C200 per se do not change. Accordingly, the capacitance CT100 of the MOS type variable capacitance device 200 as the synthesis capacitance of them shows a characteristic having a linearity within a range corresponding to the capacitance change regions due to the capacitance C100 and C200 relative to the inter-terminal voltage VT as shown in FIG. 17b.

However, the prior art described above involves, the following problems. That is, in the MOS type variable capacitance devices 200 disclosed in the Patent Document 1, the linear characteristic of the capacitance CT100 is obtained by the synthesis of the capacitance changes in the two regions of different flat band voltages, for the variable capacitance device 102 required for the VCO circuit 100, a characteristic of wider range and of good linearity to the control voltage VT is sometimes demanded. In the MOS type capacitance device 200, a plurality of regions of flat band voltages different with each other have to be formed. For preparing a plurality of regions, an exposure mask for selectively diffusing impurities is further necessary and, correspondingly, additional steps such as an exposure step and cleaning step are required. The manufacturing steps are complicated and the manufacturing cost increases inevitably to bring about a problem.

The present invention has been achieved in order to solve the problem in the prior art described above. That is, the object is to provide a MOS type variable capacitance device that can obtain a characteristic with a good linearity over a wide range relative to the control voltage VT, and cope with the improvement of the performance of the VCO circuit and the like and, in addition, has a simple structure and can be manufactured easily with no requirement of adding a mask and steps in the general process for manufacturing semiconductor circuit devices.

SUMMARY OF THE INVENTION

For attaining the object, a MOS type variable capacitance device according to a first aspect of the invention comprises at least one first semiconductor layer constituted with a first conduction type, at least one second semiconductor layer in adjacent to the first semiconductor layer and constituted with a second conduction type, a gate insulative layer disposed at least each by one just over each of the first and the second semiconductor layers, a gate layer arranged on the gate insulative layer and a first conduction type or second conduction type source layer which is arranged adjacent to the gate insulative layer, in which the gate layer and the source layer are used as electrodes.

The MOS type variable capacitance device according to the first aspect has a first MOS structure comprising a first conduction type first semiconductor layer, a gate insulative layer, a gate layer, and a first or second conduction type source layer adjacent to the gate insulative layer, as well as a second MOS structure comprising a second conduction type second semiconductor layer, a gate insulative layer, a gate layer, and a first or second conduction type source layer adjacent to the gate insulative layer.

Thus, one of the first and the second MOS structures constitutes a usual enhancement type MOS structure in which the conduction type is different between the source layer and the back gate. The other of them constitutes a MOS structure in which the conduction type is identical between the source layer and the back gate. The two different MOS structures can be connected in parallel to constitute a MOS type variable capacitance device.

In a usual enhancement type MOS structure, the state of carriers in the first or second semiconductor layer just below the gate insulative layer changes from the inverted state to a depletion state in accordance with the bias voltage between the electrodes. In accordance with the change, the capacitance of the MOS capacitor between the electrodes changes from the capacitance due to the gate insulative film alone to the capacitance due to serial connection of the gate insulative layer and the depletion layer to decrease the capacitance value. The decrease of the capacitance value becomes abrupt by the decrease of the capacitance by serial connection and, the decrease of the capacitance value itself due to the extension of the depletion layer.

On the contrary, in the MOS structure in which the conduction type is identical between the source layer and the back gate, the state of carriers in the first or second semiconductor layer just below the gate insulative layer changes from the state near accumulation to the state of depletion in accordance with the bias voltage between the electrodes. In accordance with the change, the capacitance of the MOS capacitor between the electrodes decreases in accordance with the extension of depletion layer in the capacitance by the serial connection of the gate insulative layer and the depletion layer. Since the decrease of the capacitance value depends only on the extension of the depletion layer, it decreases moderately.

The MOS type variable capacitance device comprises the two different MOS structures connected in parallel described above, and the capacitance value is a synthesis capacitance values for both of them. The bias voltage value at which the capacitance change occurs is generally different in each of the MOS structures and, in addition, an abrupt capacitance change characteristic and a moderate capacitance change characteristic are combined, so that the synthesis capacitance value has a linear characteristic to a bias voltage for a wide range. A MOS type variable capacitance device easy for capacitance control can be obtained.

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

DETAILED DESCRIPTION OF THE PREFERRED EMBODIMENTS

Embodiments of embodying the present invention are to be described specifically with reference to FIG. 1 to FIG. 12.

Figure 1:
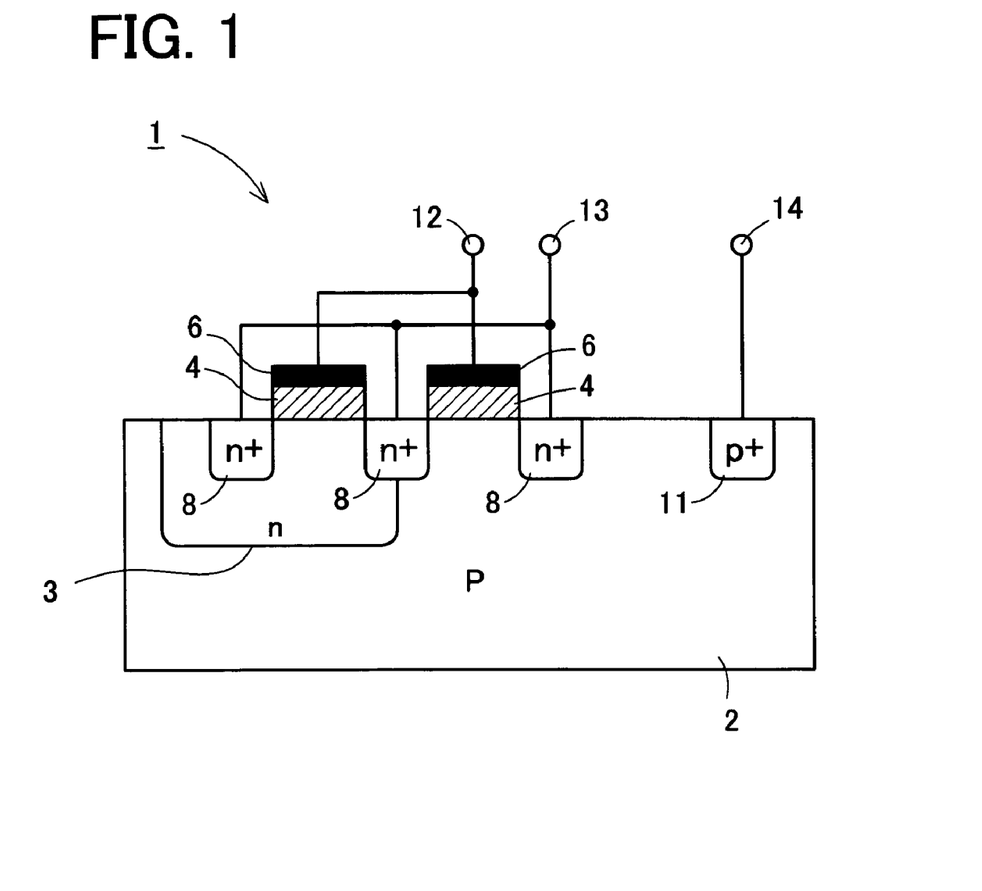
FIG. 1 is a cross sectional view of a MOS type variable capacitance device in Embodiment 1.

FIG. 1 shows an example of applying the invention to a MOS type variable capacitance device 1 as Embodiment 1. In a MOS type variable capacitance device 1, an n-well 3 is formed in a p-type semiconductor substrate 2. A gate insulative film 4 is formed on the p-type semiconductor substrate 2 and the n-well 3, and a gate electrode 6 is formed on the gate insulative film 4. Three source layers 8 selectively diffused with n-type impurities at high concentration are formed adjacent to the gate insulative film 4, and in the p-type semiconductor substrate 2, the n-well 3 and the region over the p-type semiconductor substrate 2 and the n-well 3 on each surface thereof. Further, a contact layer 11 selectively diffused with p-type impurities at high concentration is formed to the surface of p-type semiconductor substrate being spaced from the source layer 8. A voltage is supplied from a terminal 12 to a gate electrode 6. A voltage is applied from a terminal 13 to the source layer 8 and from a terminal 14 to the contact layer 11.

In a case of using the MOS type variable capacitance device 1 as a variable capacitance device 102 in a VCO circuit 100, the terminal 13 as the terminal for the source layer 8 is connected with a node 104. Further, the terminal 12 as the terminal for the gate electrode 6 is connected with a node 105. The inter-terminal voltage VT is a differential voltage from the node 105 to the node 104 in a case where the node 105 is at a reference voltage. Further, the terminal 14 is connected with a ground voltage.

Figure 2A:
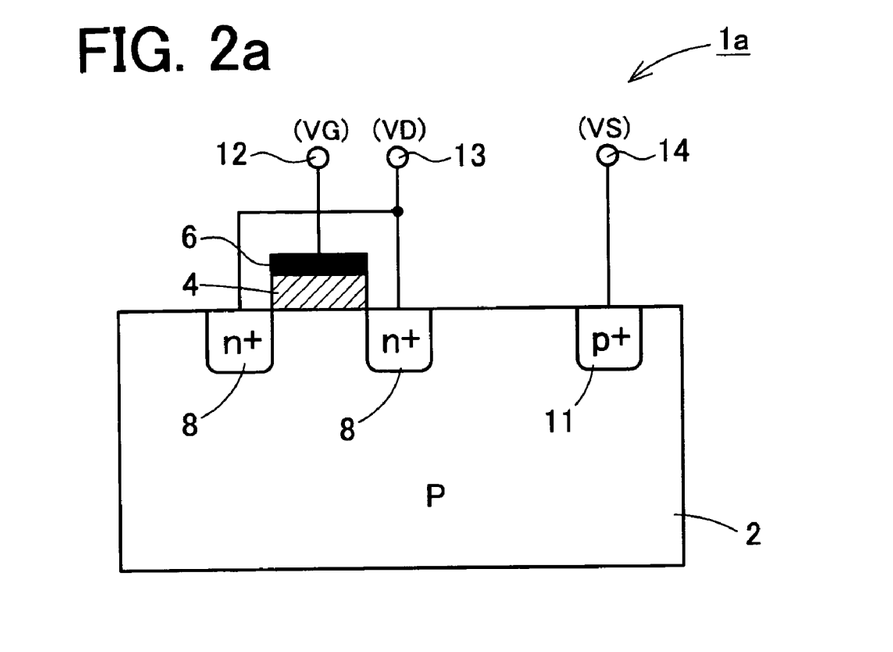
FIGS. 2a and 2b are cross sectional views in a case of dividing the MOS type variable capacitance device according to Embodiment 1 into two parts.
Figure 2B:
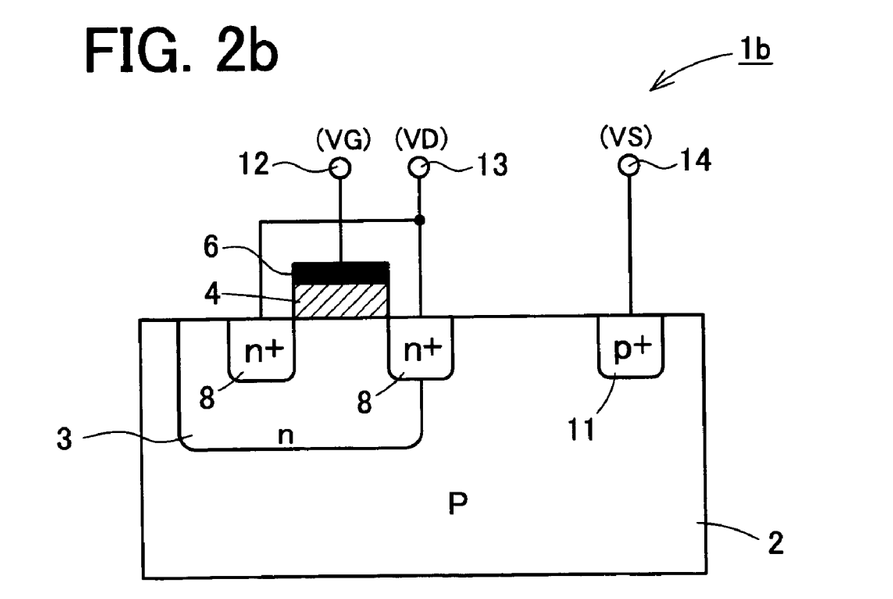

The operation of the MOS type variable capacitance device 1 is to be described for two portions separately as shown in FIG. 2. FIG. 2a shows a MOS type variable capacitance 1a not relevant to the n-well 3 in the MOS type variable capacitance device 1. On the other hand, FIG. 2b is a MOS type variable capacitance 1b which is a portion relevant to the n-well 3 in the MOS type variable capacitance 1.

In the MOS type variable capacitance device 1a, voltages VG, VD, and VS are applied to the terminals 12, 13, and 14 respectively. The voltage VS applied to the terminal 14 is a ground voltage. A control voltage VC (refer to FIG. 14) is applied as the voltage VD. A constant voltage is applied as the voltage VG to the terminal 12 and the inter-terminal voltage VT can be written as: VT=VD−VG. Increase or decrease of the inter-terminal voltage VT is controlled by increase and decrease of the voltage VD.

Figure 3A:
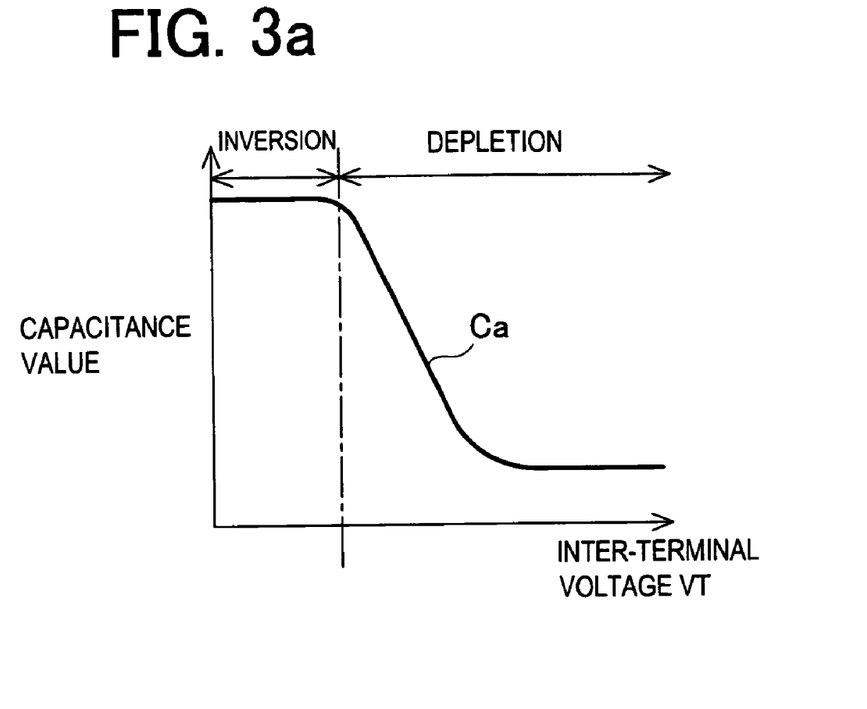
FIGS. 3a and 3b are graphs showing the characteristic for a MOS type variable type capacitance devices 1a and 1b.

In a case where the inter-terminal voltage VT is small and the difference voltage of the voltage VD to the voltage VG is not large, an inverted layer is formed just below the gate oxide film 4. The capacitance Ca between the terminals 12 and 13 in the MOS type variable capacitance device 1*a* forms a capacitance of the gate oxide film 4 and a constant capacitance value is maintained. As the inter-terminal voltage VT increases and the voltage VD increase relative to the voltage VG, a depletion layer extends from the junction surface between the source layer 8 and the p-type semiconductor substrate 2 toward the p-type semiconductor substrate 2. The capacitance Ca is a capacitance formed by serial connection of the gate oxide film 4 and the depletion layer by which the capacitance value decreases. FIG. 3*a* shows the characteristic of the capacitance Ca to the inter-terminal voltage VT. In the MOS type variable capacitance device 1*a*, the capacitance change can be obtained by the change of the depletion layer from the inverted region to the depletion region.

Then, the MOS type variable capacitance device 1*b*, voltages VG, VD, and VS are applied to the terminals 12, 13, and 14, respectively. The voltage VD is applied to the n-well 3. A control voltage VC (refer to FIG. 14) is applied as the voltage VD to the terminal 13. A constant voltage is applied as the voltage VG to the terminal 12. Since the inter-terminal voltage VT is: VT=VD−VG, increase and decrease of the inter-terminal voltage VT is controlled by increase and decrease of the voltage VD.

Figure 3B:
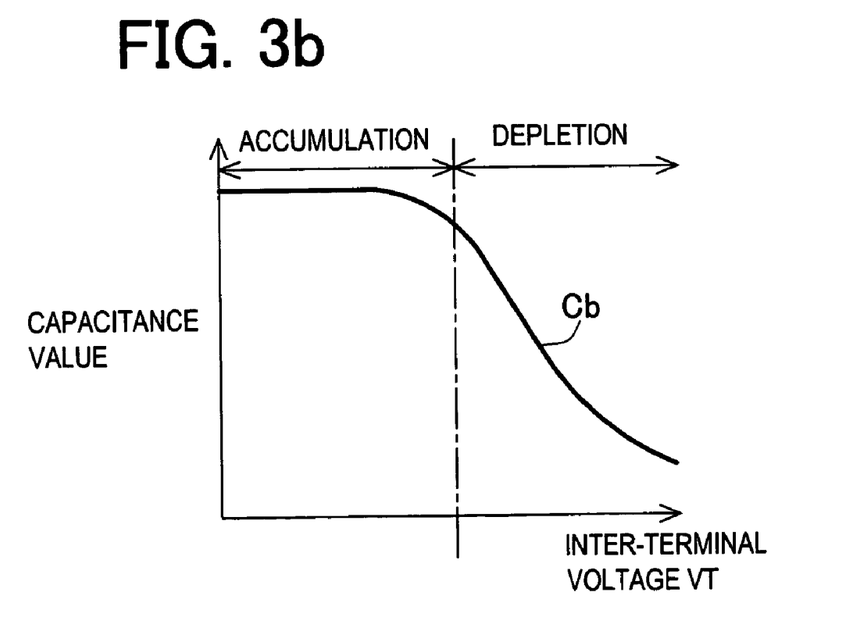

Corresponding to the change of the inter-terminal voltage VT from a small voltage value to a large voltage value, the difference voltage of the voltage VD to the voltage VG increases. Thus, a depletion layer extends just below the gate oxide film 4 from the state near the formation of the accumulation layer. FIG. 3*b* shows a characteristic of the capacitance Cb relative to the inter-terminal voltage VT. In the MOS type variable capacitance device 1*b*, the capacitance Cb is a capacitance formed by serial connection of the gate oxide film 4 and the depletion layer which has a characteristic that the depletion layer extends gradually from the state near the accumulation region, and the change of capacitance where the capacitance value decreases can be obtained.

When the capacitance Ca and Cb are compared in FIG. 3*a* and FIG. 3*b*, in the MOS type variable capacitance device 1*a*, when a depletion layer is formed from the state where the inverted layer is formed and a constant capacitance value is maintained by the gate oxide film 4, the capacitance component due to the depletion layer is connected in series. Since the capacitance value itself formed by serial connection is also decreased due to extension of the depletion layer in addition to the decrease of the capacitance value due to the serial connection of the capacitance component, the capacitance Ca shows a characteristic where the capacitance value decreases abruptly in accordance with the inter-terminal voltage VT. On the contrary, in the MOS type variable capacitance device 1*b*, the depletion layer is formed from the stage of the voltage value where the inter-terminal voltage VT is small, and the capacitance Cb is obtained by serial connection of the capacitance component by the gate oxide film 4 and the capacitor component by the depletion layer. Accordingly, the decreasing characteristic of the capacitance value by the inter-terminal voltage VT depends only on the depletion layer, and the curve for the change of the capacitance value relative to the inter-terminal voltage VT is more moderate compared with the case of the MOS type variable capacitance device 1*a*.

Figure 4A:
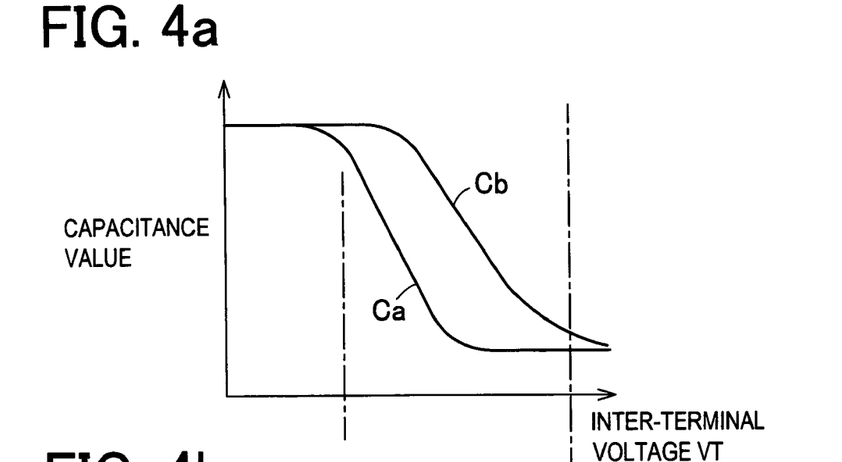
FIGS. 4a to 4c are views showing the characteristic of the MOS type variable capacitance device according to Embodiment 1.
Figure 4B:
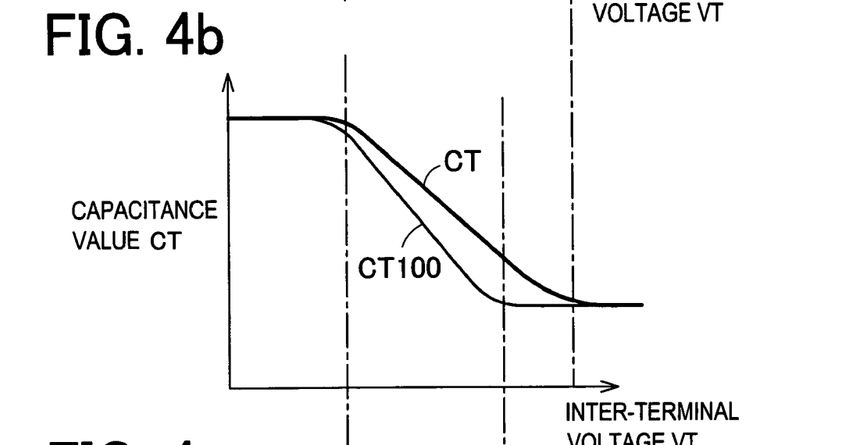
Figure 4C:
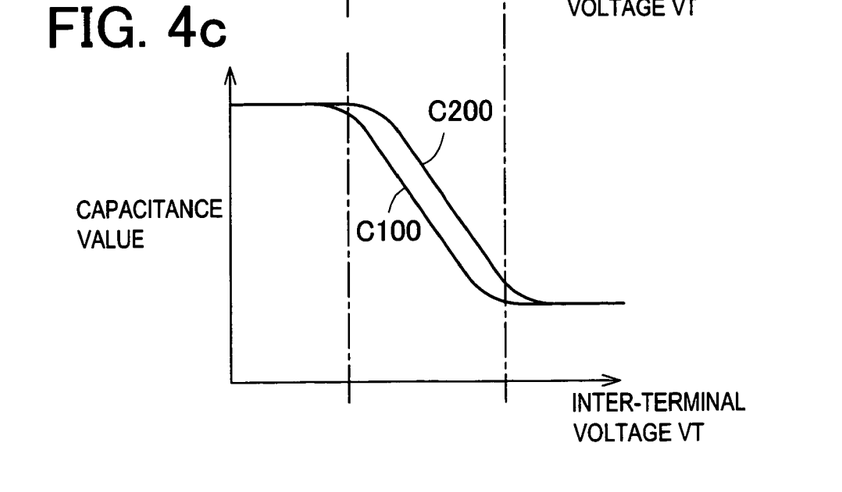

The change of characteristic of the capacitances Ca and Cb of the MOS type variable capacitance devices 1*a* and 1*b* shown in FIG. 3*a* and FIG. 3*b* is shown again being overwritten in FIG. 4*a*. The capacitance CT of the MOS type variable capacitance device 1 is formed by parallel connection of the capacitances Ca and Cb of the MOS type variable capacitance devices 1*a* and 1*b*. Accordingly, as shown in FIG. 4*b*, the characteristics of the capacitance change to the inter-terminal voltage VT as shown in FIG. 4*b* is a synthesis characteristic for the change of the capacitance of the capacitances Ca and Cb shown in FIG. 4*a*. FIG. 4*b* also shows the characteristic (FIG. 17*b*) for the change of the capacitance CT100 of the MOS type variable capacitance device 200 in the prior art obtained by synthesis of the characteristic changes of the capacitances C100 and the C200 (FIG. 17*a*) shown in FIG. 4*c* obtained from the two regions (203*a*, 203*b*) of different flat band voltages together for comparison. Since the capacitance change of the MOS type variable capacitance device 1*b* shows a moderate curve, the characteristic of the capacitance change of the MOS type variable capacitance device 1 has a good linearity relative to the inter-terminal voltage VT and a characteristic which is linear for a wider range compared with the characteristic of the capacitance change of the MOS type variable capacitance device 200 as the prior art can be obtained. Accordingly, this can contribute also to the improvement for the performance of the VCO circuit 100.

Further, the MOS type variable capacitance device 1 can be manufactured easily by using the ordinary manufacturing steps for semiconductor integrated circuit devices. Accordingly, it does not increase the cost due to the increase of masks.

Figure 5:
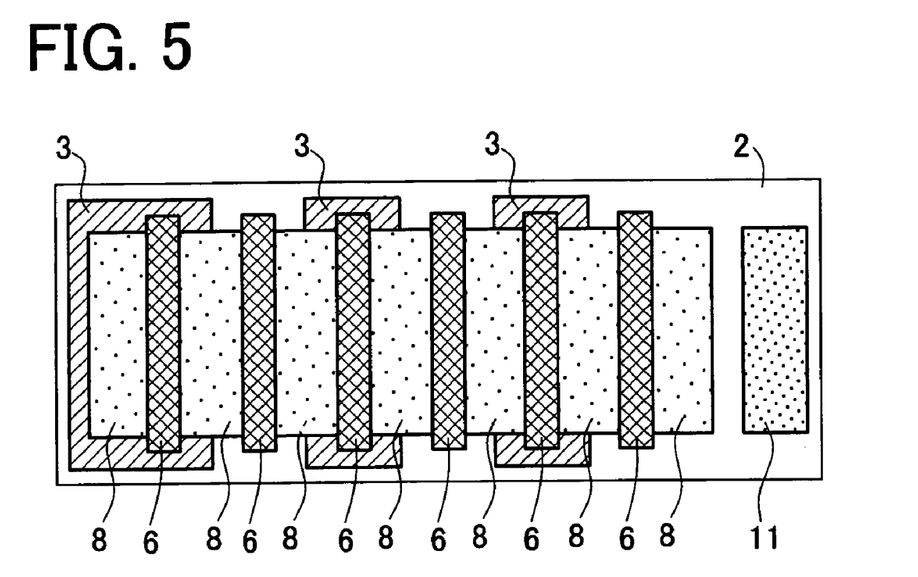
FIG. 5 is a view showing a Layout Example 1 of the MOS type variable capacitance device according to Embodiment 1.
Figure 6:
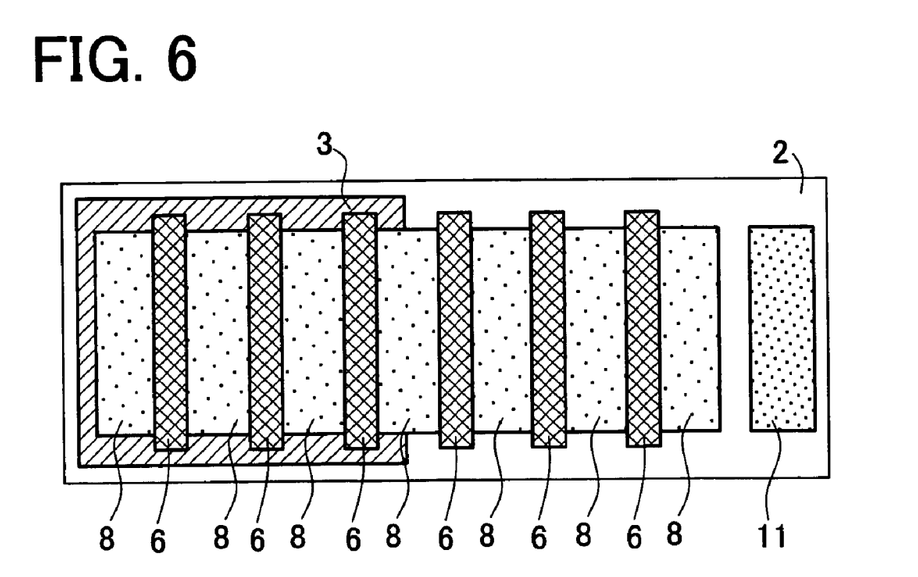
FIG. 6 is a view showing a Layout Example 2 of the MOS type variable capacitance device according to Embodiment 1.
Figure 7:
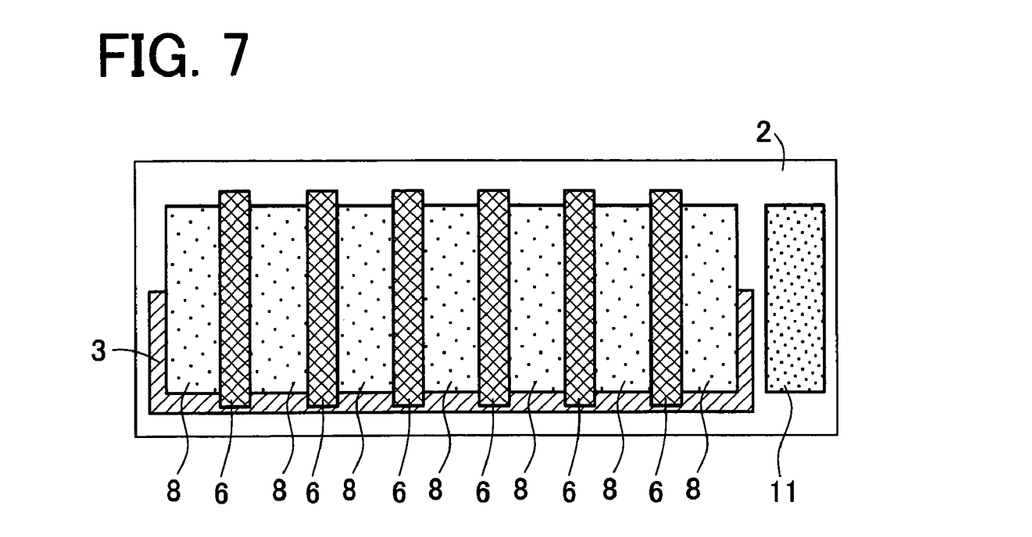
FIG. 7 is a view showing a Layout Example 3 of the MOS type variable capacitance device according to Embodiment 1.
Figure 8:
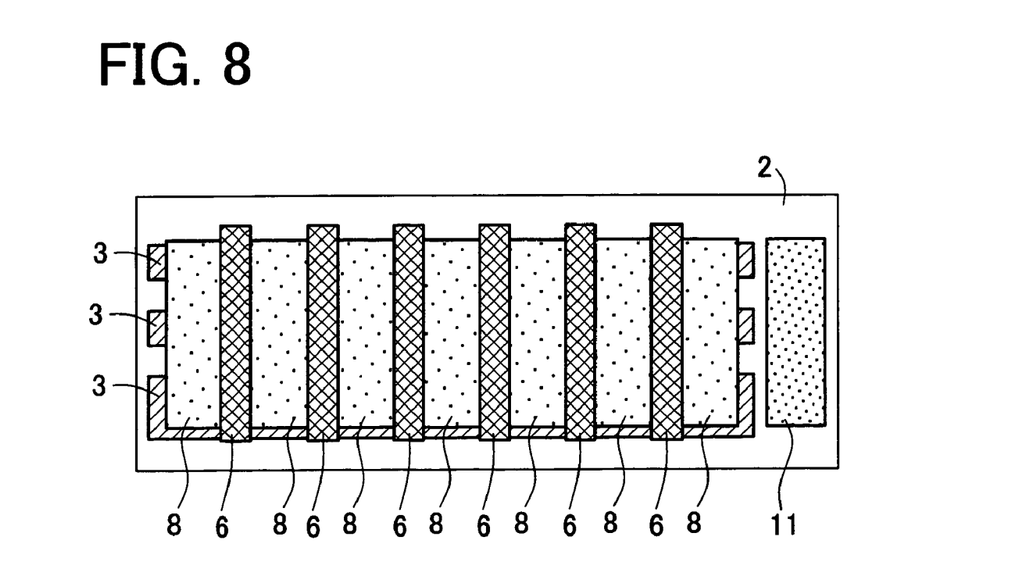
FIG. 8 is a view showing a Layout Example 4 of the MOS type variable capacitance device according to Embodiment 1.
Figure 9:
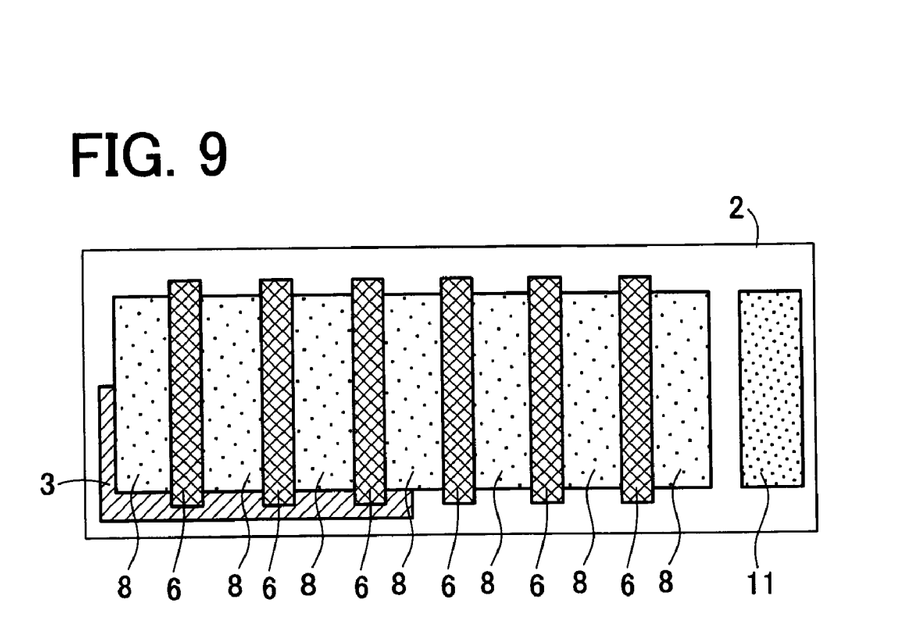
FIG. 9 is a view showing a Layout Example 5 of the MOS type variable capacitance device according to Embodiment 1.
Figure 10:
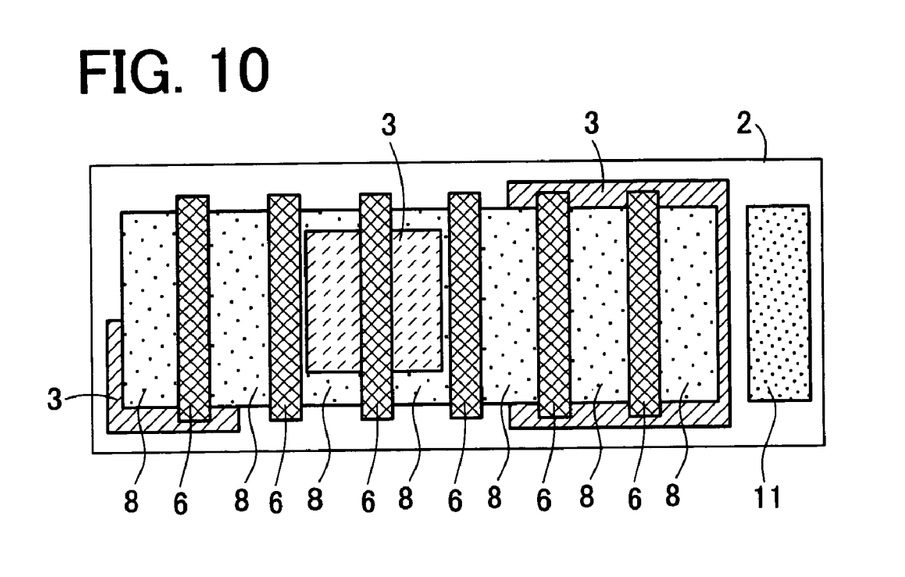
FIG. 10 is a view showing a Layout Example 6 of the MOS type variable capacitance device according to Embodiment 1.

FIG. 5 to FIG. 10 are examples of the layout when the MOS type variable capacitance device 1 is viewed from above. In FIG. 5 to FIG. 10, source layers 8 and gate electrodes 6 are arranged alternately over the p-type semiconductor substrate 2. A gate insulative film (not illustrated) is disposed under the gate electrode 6. Further, a contact layer 11 is disposed separately to the p-type semiconductor substrate 2. The n-wells 3 are arranged optionally in FIG. 5 to FIG. 10. In FIG. 5, the region is divided into three portions in which the units of the MOS type variable capacitance devices defined by the gate electrodes 6 are arranged so as to be included on every other of them. In FIG. 6, they are arranged while including adjacent three units of MOS type variable capacitance devices. In FIG. 7, they are arranged while including a portion in the direction of the channel width of the units of the MOS type variable capacitance devices. In FIG. 8, they are arranged in three regions on both ends and the intermediate portion in the direction of the channel width of the units of the MOS type variable capacitance devices units. In FIG. 9, they are arranged while including a portion in the direction of the channel width to the adjacent three units of the MOS type variable capacitance devices. FIG. 10 shows an arrangement in combination of the arrangements of FIG. 6 and FIG. 9. In any of them, the variable capacitance characteristics to the inter-terminal voltage VT as described above can be provided. For the arrangement of the n-wells 3, they can be arranged not being restricted thereto but can be arranged in an any appropriate portion.

Figure 11:
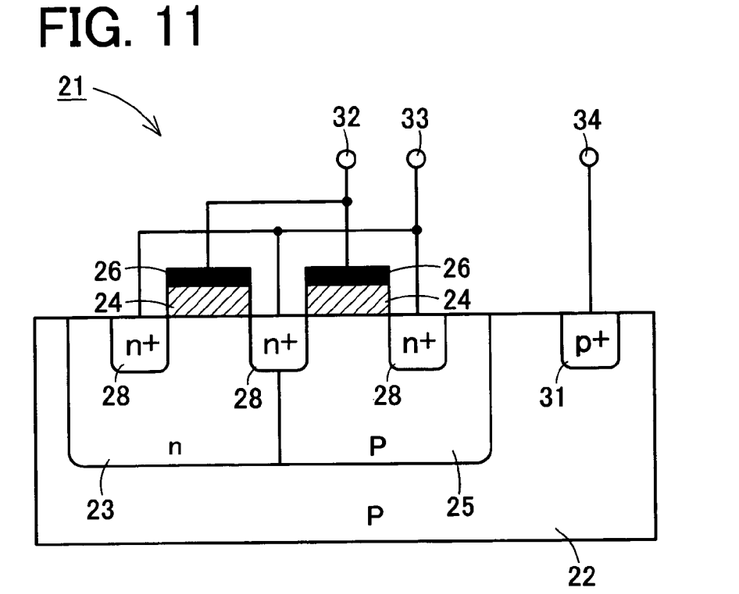
FIG. 11 is a cross sectional view for a MOS type variable capacitance device according to Embodiment 2.

FIG. 11 shows an example where the invention is applied to a MOS type variable capacitance element 21 as Embodiment 2. For the MOS type variable capacitance device 21, an n-well 23 and a p-well 25 are formed in a p-type semiconductor substrate 22. A gate insulative film 24 is formed to the n-well 23 and the p-well 25, and a gate electrode 26 is formed on the gate insulative film 24. Three source layers 28 selectively diffused with n-type impurities at high concentration are formed adjacent to the gate insulative film 24 and in the n-well 23, p-well 25 and in a region over the n-well 23 and the p-type well 24 at each of the surfaces at thereof. Further, a contact layer 31 selectively diffused with p-type impurities at high concentration is formed being spaced apart from the source layer 28 to the surface of the p-type semiconductor substrate 22. A voltage is supplied from the terminal 32 to the gate electrode 26. A voltage is supplied from the terminal 33 to the source layer 28 and from the terminal 34 to the contact layer 31. Since the operation, and the function and the effect thereof of the MOS type variable capacitance device 21 are basically identical with those of the MOS type variable capacitance device 1, explanations are omitted here.

Figure 12:
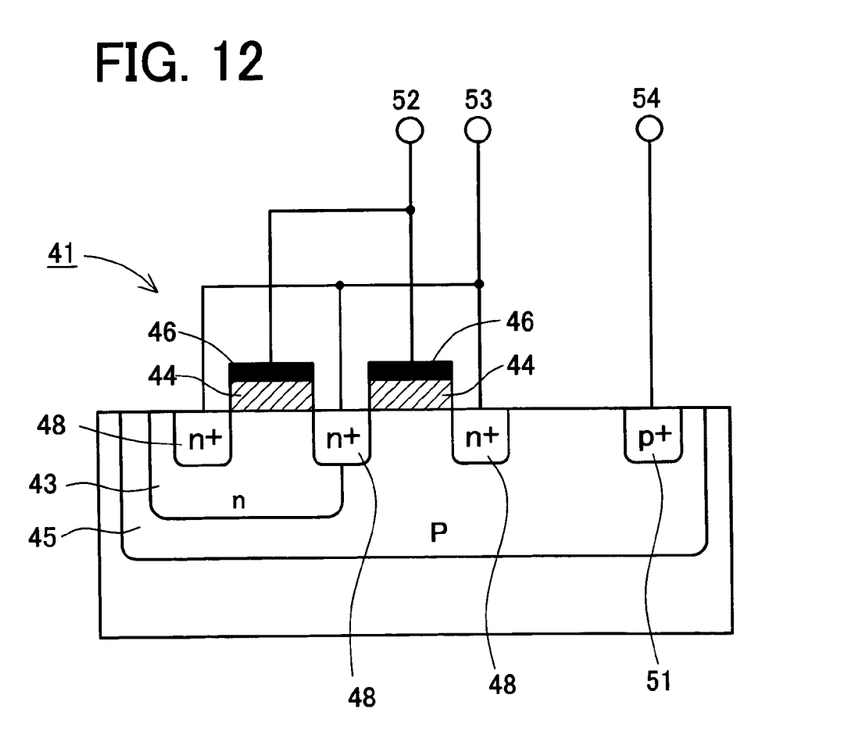
FIG. 12 is a cross sectional view for a MOS type variable capacitance device according to Embodiment 3.

Alternatively, as in a MOS type variable capacitance device 41 shown in FIG. 12, a p-well 45 may be formed in a p-type semiconductor substrate, and an n-well 43 may be formed in the p-well 45 as Embodiment 3.

A gate insulative film 44 is formed on the p-well 45 and the n-well 43, and a gate electrode 46 is formed on the gate insulative film 44. Three source layers 48 selectively diffused with n-type impurities at high concentration are formed adjacent to the gate insulative film 44, in the p-well 45, the n-well 43 and in the region riding over the p-well 45 and the n-well 43 at each of the surfaces thereof. Further, a contact layer 51 selectively diffused with p-type impurities at high concentration is formed to the surface of the p-well 45 being spaced apart from the source layer 48. A voltage is supplied to the gate electrode 46 from the terminal 52. A voltage is supplied to the source layer 48 from the terminal 53 and to the contact layer 51 from the terminal 54. Also in this case, the operation and the function and effect thereof basically identical with those of the MOS type variable capacitance device 1 can be obtained.

It is possible to select the MOS type variable capacitance device 1, 21 or 41 in accordance with the convenience of the manufacturing steps for semiconductor integrated circuit devices. Further, in any of the cases, the n-wells can be arranged at appropriate positions as shown in the Embodiment 1.

According to the MOS type variable capacitance device of the embodiments described specifically above, the n-well 3 is formed in the p-type semiconductor substrate 2 in Embodiment 1 (FIG. 1). The p-well 25 and the n-well 23 are formed in Embodiment 2 (FIG. 11). The n-well 43 is formed in the p-well 45 in Embodiment 3 (FIG. 12). The gate insulative films 4, 24 are formed just over the p-type semiconductor substrate 2 and the n-well 3, p-well 25 and the n-well 23 or the p-well 45 and the n-well 43, and the gate electrodes 6, 26 are formed on the gate insulative films 4, 24. Three source layers 8, 28 selectively diffused with n-type impurities at high concentration are formed in adjacent to the gate insulative films 4, 24, in the p-type semiconductor substrate 2 and the n-well 3, p-well 25 and the n-well 23, or p-well 45 and n-well 43 to each surface thereof. By applying a control voltage VT between the source layers 8, 28 and the gate electrodes 6, 26, a capacitance characteristic with good linearity can be obtained over the wide range relative to the control voltage VT.

That is, two different MOS structures conduction types, that is, a usual enhancement type MOS structure constituted with the source layers 8, 28, the p-type semiconductor substrate 2, the p-well 25 as the back gate of conduction type different from each other, and MOS structure constituted with the source layers 8, 28 and the n-well 23 as the back gate of the conduction type identical with each other. Such MOS structures can be connected in parallel to constitute a MOS type variable capacitance device.

In the usual enhancement type MOS structure, the state of carriers in the back gate just under the gate insulative films 4, 24 changes from the inverted state to the depletion state in accordance with the control voltage VT between the electrodes. In accordance with the change, the capacitance of the MOS capacitor between the electrodes changes from the capacitance due to the gate insulative films 4, 24 alone into the capacitance due to the serial connection of the gate insulative films 4, 24 and the depletion layer and the capacitance value decreases. In this case, decrease of the capacitance value becomes abrupt by the decrease due to the serial connection of the capacitance and, in addition, due to the decrease of the capacitance value per se by the extension of the depletion layer.

On the contrary, in the MOS structure in which the conduction type is identical between the source layers 8, 28 and the back gate, the state of carriers in the back gate just under the gate insulative films 4, 24 changes from the vicinity of the accumulation state to the depletion state according to the control voltage VT between the electrodes. Along with the change, the capacitance of the MOS capacitor between the electrodes changes to decrease in accordance with the extension of the depletion layer in the capacitance formed by serial connection between the gate insulative film 4, 24 and the depletion layer. Since the decrease of the capacitance value depends only on the extension of the depletion layer, it decreases moderately.

The MOS type variable capacitance device 1, 21 or 41 is formed by parallel connection of the two different MOS structures and the capacitance value thereof is a synthesis capacitance value for both of them. The control voltage value at which the capacitance change occurs is generally different in each of the MOS structures and, in addition, those of abrupt characteristic of capacitance change and moderate characteristic of capacitance change are combined, so that the synthesis capacitance value has a linear characteristic relative to the bias voltage for a wide range. A MOS type variable capacitance devices of easy for the control of capacitance can be obtained.

In the MOS type variable capacitance device of the prior art, regions of different flat band voltages were provided in order to obtain a capacitance characteristic of good linearity for a wide range to the control voltage VT. However, for the change of the flat band voltage, only the control voltage value at which the capacitance change starts is shifted but the profile of the characteristic curve does not change. Accordingly, in order to obtain a capacitance characteristic of good linearity for a wide range, it was necessary to provide a plurality of regions with the flat band voltages different to each other. For providing plurality of regions of different flat band voltages, the impurity concentration has to be changed individually to make the manufacturing steps complicate. Correspondingly, it requires an additional mask and increases the number of manufacturing steps such as an exposure step and a cleaning step to increase the cost.

On the other hand, in the MOS type variable capacitance device 1, 21, 41 of the preferred embodiment, a capacitance characteristic of good linearity for a wide range relative to the control voltage VT can be manufactured easily in the usual manufacturing steps for semiconductor integrated circuit devices. Accordingly, a MOS type variable capacitance device of good capacitance characteristics can be provided at a reduced cost. Two kinds of MOS structures of different variable capacitance ranges can be constituted by the manufacturing process used ordinarily for semiconductor integrated circuit devices of the MOS structure, and the MOS type variable capacitance device 1, 21 or 41 of a wide variable capacitance range of the synthesis capacitance to the bias voltage can be attained in the usual manufacturing process and with no addition of manufacturing steps. This can be applied directly to the semiconductor integrated circuit devices manufactured so far with no additional manufacturing cost.

In this case, the concentration of the impurities in the source layers 8, 28 are made higher compared with the impurity concentration of the p-type semiconductor substrate 2 or the n-well 3, the p-well 25 or the n-well 23, the p-well 45 or the n-well 43 as the first or second semiconductor layer of an identical conduction type. The electrodes can be led easily from the source layers 8, 28.

Further, the impurity concentration in the region just under the gate insulative 4, 24 in at least one of the p-type semiconductor substrate 2 and the n-well 3, the p-well 25 and the n-well 23, or the p-well 45 and the n-well 43 is different from the impurity concentration in the bulk region. This can properly control the characteristic of the capacitance change in accordance with the control voltage VT. In this case, the impurity concentration can be controlled independently by the selective diffusion of the impurities to the region just under the gate insulative films 4, 24.

A control voltage VT for controlling the capacitance is applied to the terminals 13, 33 connected with all the source layers 8, 28. The MOS type variable capacitance devices 1, 21, 41 can be constituted between the terminals 12 and 32 connected with all the gate electrodes 6, 26. Thus, the capacitance of the MOS type variable capacitance devices 1, 21, 41 can be made as a synthesis capacitance of the two MOS structures of characteristics different from each other.

Further, as shown in FIG. 5 to FIG. 10, for the layout of the MOS structure constituted with the gate electrode 6 having the gate insulative film just below and the adjacent source layer 8, two different MOS structures can be arranged in parallel with the intermediate region of the source region 8 as a boundary. Further, the gate electrode 6 can be arranged as the extension gate insulative layer across the boundary between the p-type semiconductor substrate 2 and the n-well 3. Correspondingly, the source layer 8 can be arranged as an extended source layer or a second common source layer riding over the boundary between the p-type semiconductor substrate 2 and the n-well 3. In the layout for the MOS structure, two different kinds of MOS structures can be divided properly. For the arrangement of the n-wells 3, they can be arranged to appropriate positions not being restricted to FIG. 5 to FIG. 10. It will be apparent that an arrangement by appropriately combining FIG. 5 to FIG. 10 is also possible.

The invention is not restricted to the embodiments described above but it will be apparent that various improvements and modifications are possible within a range not departing from the gist of the invention. In the embodiments, while the invention is applied on the p-type semiconductor substrate, it will be apparent that it is applicable also on the n-type semiconductor substrate. In this case, the conduction type for all the wells, source layers and the contact layers can be of the conduction type opposite to that shown in embodiments.

Figure 13:
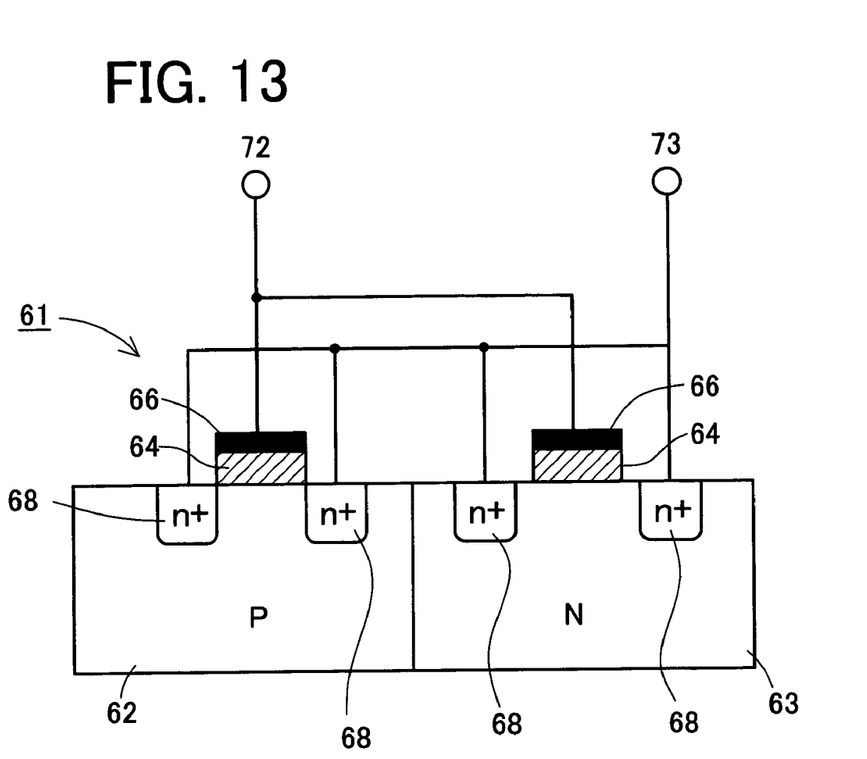
FIG. 13 is a cross sectional view for a MOS type variable capacitance device according to Embodiment 4.

Further, a MOS type variable capacitance device 61 of Embodiment 4 shown in FIG. 13 can also be constituted. It may be considered, for example, a case of polishing a semiconductor substrate at a rear face by applying SOI technique, etc. a gate insulative film 64 is formed on a p-type semiconductor layer 62 and an n-type semiconductor layer 63 adjacent to each other, and a gate electrode 66 is formed on the gate insulative 64. Source layers 68 selectively diffused with n-type impurities at high concentration are formed in adjacent to the gate insulative film 64 and in the p-type semiconductor layer 62 and the n-type semiconductor layer 63 at each of the surfaces thereof. While FIG. 13 shows a case in which the source layer 68 is formed in each of the regions of the p-type semiconductor layer 62 and the n-type semiconductor layer 63, it may be also formed to a region riding over the p-type semiconductor layer 62 and the n-type semiconductor layer 63 as shown in Embodiments 1 to 3. A voltage is supplied to the gate electrode 66 from the terminal 72. A voltage is supplied to the source layer 68 from the terminal 73. Further, it will be apparent that a predetermined voltage is supplied from a not illustrated terminal to the p-type semiconductor layer 62 and the n-type semiconductor layer 63. Also in this case, operation, and function and effect thereof which are basically identical with those of the MOS type variable capacitance device shown in Embodiments 1 to 3 can be obtained.

According to the invention, it is possible to provide a MOS type variable capacitance device capable of obtaining a characteristic of good linearity for a wide range relative to an inter-terminal voltage VT and capable of coping with the improvement of the performance of a VCO circuit, etc., as well as simple in the structure, and capable of being manufactured easily with no requirement for addition of masks and steps in the usual process for manufacturing semiconductor circuit devices.

What is claimed is:
1. A MOS type variable capacitance device, comprising:
    at least one first semiconductor layer constituted with a first conduction type;
    at least one second semiconductor layer in adjacent to the first semiconductor layer at the surface of a semiconductor substrate and constituted with a second conduction type that is different from the first conduction type;
    at least one first gate insulating layer disposed on the first semiconductor layer;
    at least one second gate insulating layer disposed on the second semiconductor layer;
    at least one gate layer arranged on the first gate insulating layer and the second gate insulating layer; and
    at least one first conduction type or at least one second conduction type source layer which is arranged adjacent to the first and second gate insulating layers, wherein
    the impurity concentration of the first or second semiconductor layer is lower than the impurity concentration of a source layer of an identical conduction type;
    when a number of the at least one gate layer is two or more, two of the gate layers are connected to each other;
    when a number of the at least one first conduction type or at least one second conduction type source layer is two or more, two of the first conduction type or the second conduction type source layers are connected to each other; and
    the gate layer and the source layer are used as electrodes.

2. The MOS type variable capacitance device according to claim 1, wherein the first semiconductor layer is the semiconductor substrate and the second semiconductor layer is formed selectively in the direction of the depth from the surface of the semiconductor substrate.

3. The MOS type variable capacitance device according to claim 1, wherein
    the first semiconductor layer is formed selectively in the direction of the depth from the surface of the semiconductor substrate, and the second semiconductor layer is formed selectively in the first semiconductor layer in the direction of the depth from the surface of the first semiconductor layer.

4. The MOS type variable capacitance device according to claim 1, wherein the first and the second semiconductor layers are formed selectively in the direction of the depth from the surface of the semiconductor substrate.

5. The MOS type variable capacitance device according to claim 1, wherein the region just below at least either one of the first or second gate insulating layer has an impurity concentration different from the impurity concentration in a bulk region of at least one of the first and the second semiconductor layers.

6. The MOS type variable capacitance device according to claim 1, wherein the first conduction type or second conduction type source layer contains a first common source layer disposed between the first gate insulating layer and the second gate insulating layer adjacent to each other, and the first common source layer is extended over the first and second semiconductor layers.

7. The MOS type variable capacitance device according to claim 1, wherein the first or second gate insulating layer includes an extended gate insulating layer arranged beyond the boundary between the first semiconductor layer and the second semiconductor layer, and the first conduction type or second conduction type source layer adjacent to the extended gate insulating layer contains an extended source layer arranged beyond the boundary between the first semiconductor layer and the second semiconductor layer, the first conduction type or second conduction type source layer adjacent between the first and second gate insulating layers contains a second common source layer arranged beyond the boundary between the first and the second semiconductor layers.

8. A MOS type variable capacitance device constituted with a synthesis capacitance of:

a first MOS type variable capacitance device; and a second MOS type variable capacitance device with a variable capacitance characteristic that is different than the variable capacitance characteristic of the first MOS type device and having a linearity for a capacitance change region for a wider voltage range applied between the terminals than that of the first MOS type variable capacitance device, wherein the second MOS type variable capacitance device comprises a back gate layer constituted with a semiconductor layer of conduction type identical with that of a source layer and a drain layer.

* * * * *